(12) United States Patent
Hlad et al.

(10) Patent No.: US 7,919,408 B2
(45) Date of Patent: Apr. 5, 2011

(54) METHODS FOR FABRICATING FINE LINE/SPACE (FLS) ROUTING IN HIGH DENSITY INTERCONNECT (HDI) SUBSTRATES

(75) Inventors: Mark S. Hlad, Chandler, AZ (US); Sheng Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 297 days.

(21) Appl. No.: 12/164,977

(22) Filed: Jun. 30, 2008

(65) Prior Publication Data

US 2009/0325379 A1  Dec. 31, 2009

(51) Int. Cl.
*H01L 21/4763* (2006.01)
(52) U.S. Cl. .......... 438/636; 438/674; 438/687
(58) Field of Classification Search .......... 438/636, 438/637, 641, 671, 672, 674, 675, 687
See application file for complete search history.

(56) References Cited

U.S. PATENT DOCUMENTS

| 5,667,940 | A  | * | 9/1997  | Hsue et al.  | 430/312 |
| 6,416,933 | B1 | * | 7/2002  | Singh et al. | 430/313 |
| 6,664,028 | B2 | * | 12/2003 | Hwang et al. | 430/312 |
| 7,470,619 | B1 | * | 12/2008 | Chen et al.  | 438/675 |

FOREIGN PATENT DOCUMENTS

| JP | 2004-047733 | 2/2004 |
| JP | 2006-135058 | 5/2006 |
| JP | 2007-235144 | 9/2007 |
| KR | 100777925   | 11/2007 |

OTHER PUBLICATIONS

Dixit, Sunit, et al., "Lithographic Performance Enhancement Using Top Antireflective Coating Compositions Made From Water-Soluble Polymers," Advances in Resist Technology and Processing XVII, Proceedings of SPIE vol. 3999 (2000), pp. 949-959.
International Search Report and Written Opinion from PCT/US2009/048873 mailed Jan. 29, 2010, 11 pgs.

* cited by examiner

*Primary Examiner* — Kevin M Picardat
(74) *Attorney, Agent, or Firm* — Blakely, Sokoloff, Taylor & Zafman LLP

(57) ABSTRACT

A method for fabricating fine line and space routing described. The method includes providing a substrate having a dielectric layer and a seed layer disposed thereon. An anti-reflective coating layer and a photo-resist layer are then formed above the seed layer. The photo-resist layer and the anti-reflective coating layer are patterned to form a patterned photo-resist layer and a patterned anti-reflective coating layer, to expose a first portion of the seed layer, and to leave covered a second portion of the seed layer. A metal layer is then formed on the first portion of the seed layer, between features of the patterned photo-resist layer and the patterned anti-reflective coating layer. The patterned photo-resist layer and the patterned anti-reflective coating layer are subsequently removed. Then, the second portion of the seed layer is removed to provide a series of metal lines above the dielectric layer.

21 Claims, 4 Drawing Sheets

US 7,919,408 B2

METHODS FOR FABRICATING FINE LINE/SPACE (FLS) ROUTING IN HIGH DENSITY INTERCONNECT (HDI) SUBSTRATES

TECHNICAL FIELD

Embodiments of the invention are in the field of semiconductor structures and, in particular, methods for fabricating fine line and space (FLS) routing for high density interconnect (HDI) substrates.

BACKGROUND

A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

C4 solder ball connections have been used for many years to provide flip chip interconnections between semiconductor devices and substrates. Hemispherical C4 solder bumps are formed above an insulation layer and above the exposed surfaces of connector pads (also known as bump pads), each of which is exposed through a via hole in the insulation layer or layers. Subsequently, the solder bumps are heated above their melting point until they reflow and form a connection with the Cu stud bumps of the die. The actual C4 solder bumps may be fabricated using a number of different processing techniques, including evaporation, screen printing, and electroplating. Fabrication by electroplating requires a series of basic operations which typically include the deposition of a metallic seed layer, the application of an imaged photo-resist (in the pattern of C4 solder bumps), the electro-deposition of solder, the stripping of the photo-resist, and the sub-etching of the metallic seed layer to isolate the C4 bumps.

As semiconductor structures become more advanced, the need for higher I/O density leads to a tighter C4 bump pitch. This, in turn, puts stringent requirements on the fabrication and dimensions of the line and spacing.

DETAILED DESCRIPTION

Figure 1:
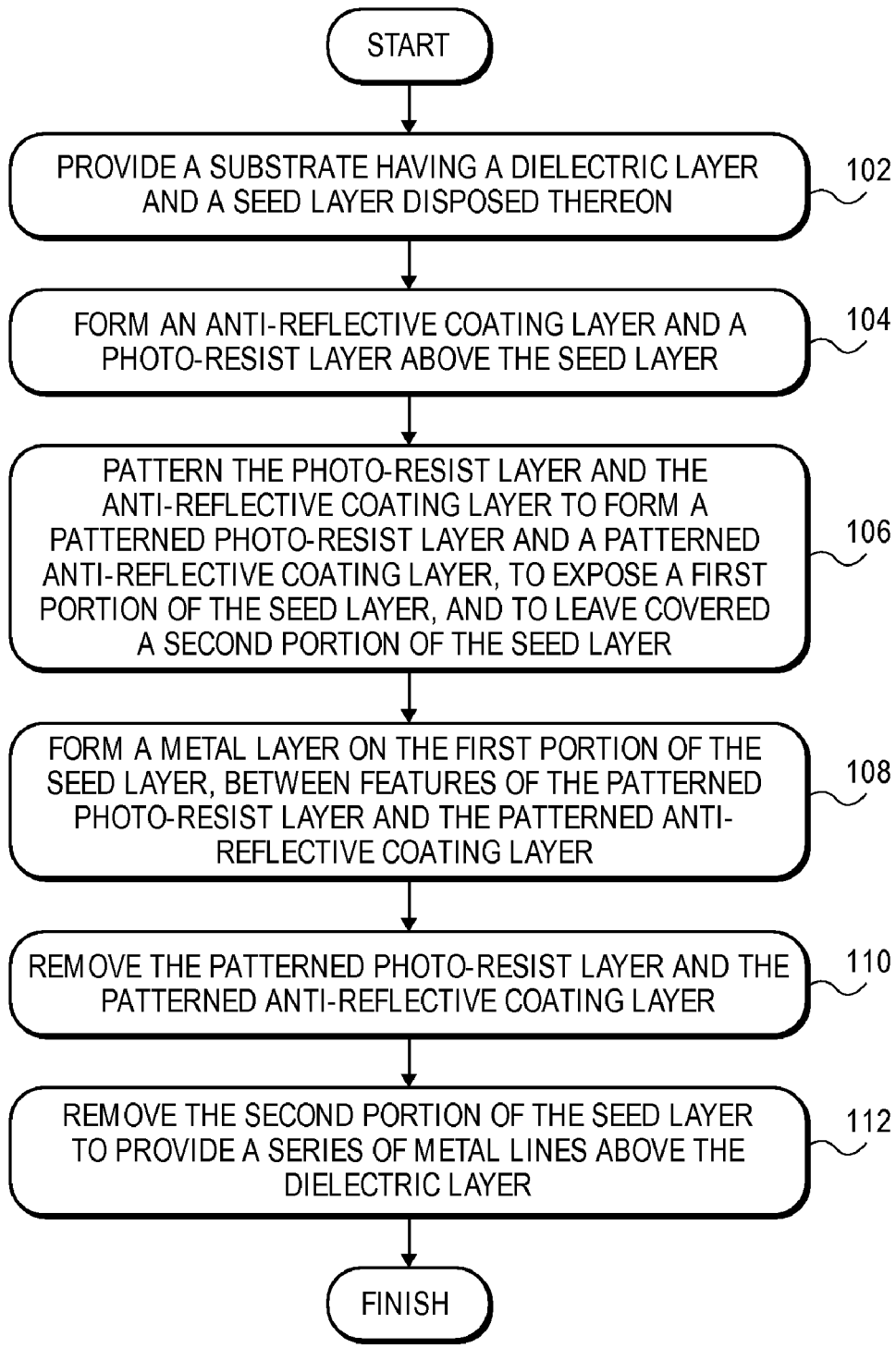
FIG. 1 is a Flowchart representing operations in a method for fabricating fine line and space routing in an organic substrate package, in accordance with an embodiment of the present invention.

Methods for fabricating fine line and space routing in an organic substrate package are described. In the following description, numerous specific details are set forth, such as integration schemes and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Disclosed herein are methods for fabricating fine line and space routing. A substrate may be provided having a dielectric layer and a seed layer disposed thereon. In an embodiment, an anti-reflective coating layer and a photo-resist layer are formed above the seed layer. The photo-resist layer and the anti-reflective coating layer are then patterned to form a patterned photo-resist layer and a patterned anti-reflective coating layer, to expose a first portion of the seed layer, and to leave covered a second portion of the seed layer. A metal layer is formed on the first portion of the seed layer, between features of the patterned photo-resist layer and the patterned anti-reflective coating layer. The patterned photo-resist layer and the patterned anti-reflective coating layer are subsequently removed. In one embodiment, the second portion of the seed layer is then removed to provide a series of metal lines above the dielectric layer.

In accordance with an embodiment of the present invention, the application of an anti-reflective coating layer is used to control the amount of reflection from a seed layer, by absorbing the reflected light during a lithographic process. By absorbing the reflected light, the exposure of regions of a photo-resist layer undergoing a patterning process may be better controlled. For example, in one embodiment, the undesirable exposure of regions of the photo-resist layer is substantially reduced, if not eliminated, by using an anti-reflective coating layer between the seed layer and the photo-resist layer for the lithographic process. Accordingly, line-width variation among the features in a patterned photo-resist layer may be mitigated as compared with line-width variation resulting from scattering in the absence of an anti-reflective coating layer. In one embodiment, by incorporating an anti-reflective coating layer into an integration scheme for fabricating fine lines and spaces, the density of such routing can be increased, while the line-widths of individual lines in such routing can decreased, to enable the scaling of such routing to accommodate ever the increasing I/O density. In accordance with an embodiment of the present invention, the use of an anti-reflective coating layer between a seed layer and a photo-resist layer for a lithographic process reduces the extent of line-edge roughness (e.g. reflective notching) common to processes that do not use an anti-reflective coating layer.

In an embodiment of the present invention, an anti-reflective coating layer is used in a method for fabricating fine line and space routing. FIG. 1 is a Flowchart 100 representing operations in a method for fabricating fine line and space routing in an organic substrate package, in accordance with an embodiment of the present invention. FIGS. 2A-2H illustrate cross-sectional views representing operations in a method for fabricating fine line and space routing in an organic substrate package, in accordance with an embodiment of the present invention.

Figure 2A:
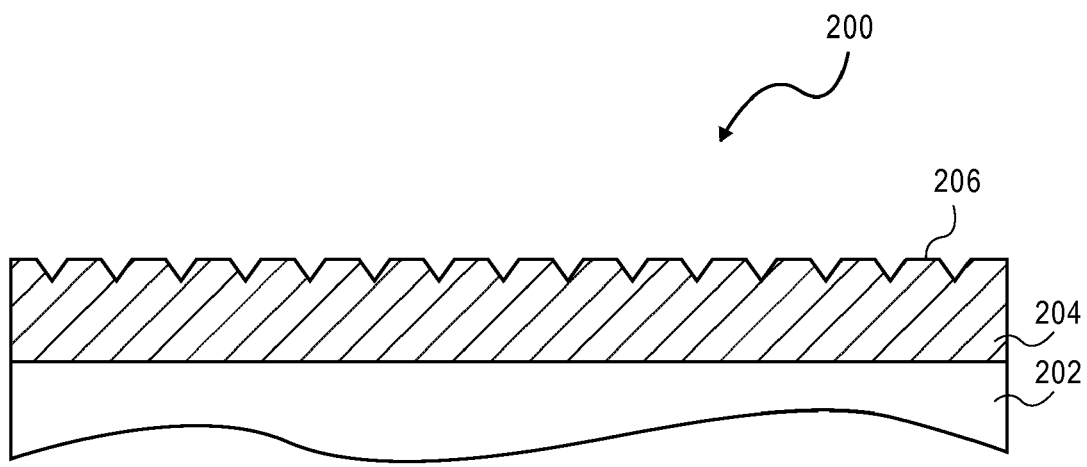
FIGS. 2A-2H illustrate cross-sectional views representing operations in a method for fabricating fine line and space routing in an organic substrate package, in accordance with an embodiment of the present invention.

Referring to operation 102 from Flowchart 100 and corresponding FIG. 2A, a build-up layer 202 is provided having a dielectric layer 204 disposed thereon. In accordance with an embodiment of the present invention, build-up layer 202 and dielectric layer 204 form a stack of layers 200 included in an organic substrate package. For example, in one embodiment, the stack of layers 200 can include any build-up layer that requires fine line and space routing. In an embodiment, dielectric layer 204 has a roughened surface 206, e.g. dielectric layer 204 is subjected to a desmear process, as depicted in FIG. 2A.

Dielectric layer 204 may be a layer suitable for electrically isolating devices and interconnects on the face of build-up layer 202 from subsequently formed fine line/space routing disposed above or below the dielectric layer 204. In an embodiment, dielectric layer 204 is composed of an epoxy-based material with silica fillers. In one embodiment, dielectric layer 204 has a roughened surface 206 with an average surface roughness approximately in the range of 0.5-0.6 microns, i.e. the average depth of the V-grooves in roughened surface 206 is approximately in the range of 0.5-0.6 microns. In an embodiment, dielectric layer 204 is roughened to have roughened surface 206 in order to better adhere with a subsequently deposited metal layer, such as an electro-less deposited metal layer, as described below. In an embodiment, roughened surface 206 of dielectric layer 204 is formed by desmear process following laser via drilling. In an embodiment, the surface of dielectric layer 204 is not roughened.

Build-up layer 202 may be composed of a material suitable for semi-additive process (SAP) fabrication. In one embodiment, build-up layer 202 is an epoxy based dielectric material with silica fillers. In another embodiment, build-up layer 202 includes a copper plane.

Figure 2B:
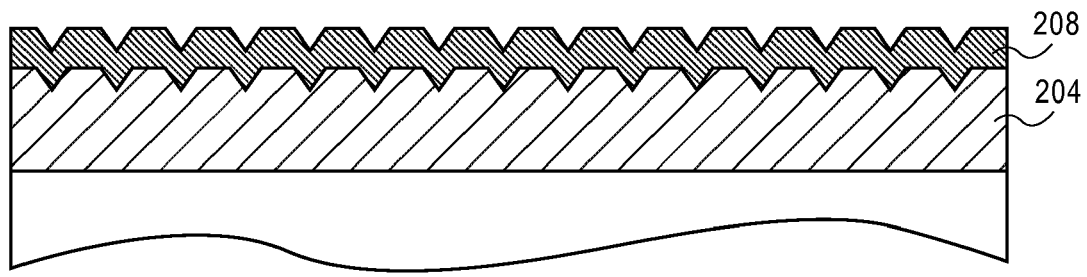

Referring again to operation 102 from Flowchart 100 and corresponding FIG. 2B, a seed layer 208 is disposed on dielectric layer 204. In accordance with an embodiment of the present invention, seed layer 208 is formed to be conformal with dielectric layer 204, e.g. seed layer 208 has the same or a similar topography as roughened surface 206, as depicted in FIG. 2B. In an embodiment, seed layer 208 partially or completely fills any top surface roughness of dielectric layer 204 to provide a substantially flat top surface for seed layer 208. In an embodiment, seed layer 208 has a thickness approximately in the range of 0.5-1 microns. In an embodiment, seed layer 208 has a thickness of approximately 0.7 microns. Seed layer 208 may be a layer suitable for subsequent electrolytic plating of a metal film onto its surface. In an embodiment, seed layer 208 is composed of a metal or metal-containing alloy such as, but not limited to, copper, silver, nickel, aluminum In an embodiment, seed layer 208 is formed on dielectric layer 204 by an electro-less deposition process. Metal sputtering is an alternative metal deposition process that could be used.

Figure 2C:
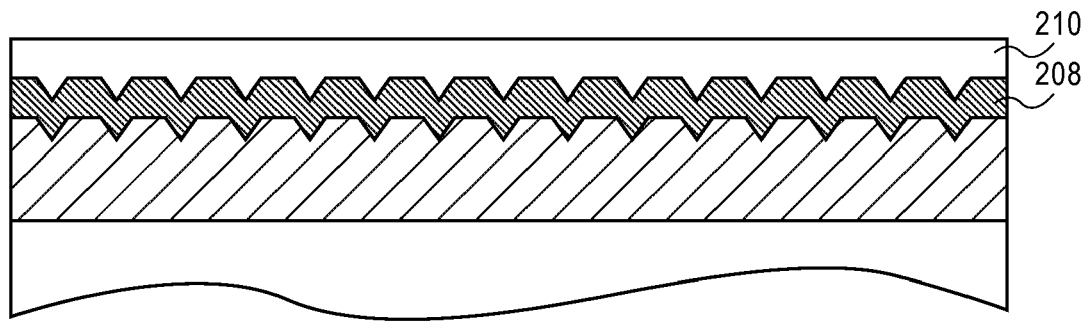

Referring to operation 104 from Flowchart 100 and corresponding FIG. 2C, an anti-reflective coating layer 210 is formed above seed layer 208. In accordance with an embodiment of the present embodiment, anti-reflective coating layer 210 is formed above seed layer 208 to absorb light reflected from the metal surface and from the roughened topography of seed layer 208, as depicted in FIG. 2C, during a subsequent lithographic process. Also, in one embodiment and as depicted in FIG. 2C, anti-reflective coating layer 210 fills in the surface roughness of seed layer 208 in order to provide a flat surface for anti-reflective coating layer 210, upon which a photo-resist layer is subsequently deposited. In an embodiment, anti-reflective coating layer 210 has a thickness, as measured from the top surface of seed layer 208, approximately in the range of 1-2 microns. In an embodiment, anti-reflective coating layer 210 has a thickness, as measured from the top surface of seed layer 208, of approximately 1.5 microns.

Anti-reflective coating layer 210 may be composed of a material that substantially absorbs scattered light produced during a lithographic process. In accordance with an embodiment of the present invention, anti-reflective coating layer 210 is composed of an organic compound and a dye. In one embodiment, anti-reflective coating layer 210 is composed of material such as, but not limited to, a water-soluble polymer Aquazol, organosiloxane based film. In an embodiment, the composition of anti-reflective coating layer 210 is selected to be chemically compatible with a photo-resist layer subsequently formed on the surface of anti-reflective coating layer 210.

Anti-reflective coating layer 210 may be formed on seed layer 208 by a technique suitable to uniformly cover seed layer 208 and to provide a flat surface upon which a photo-resist layer may subsequently be deposited. In one embodiment, anti-reflective coating layer 210 is formed by a process such as, but not limited to, spray-coating or roll-coating. In another embodiment, anti-reflective coating layer 210 is formed by a spin-on process. In an embodiment, a solvent is used to aid in the coating of anti-reflective coating layer 210 onto the surface of dielectric layer 204, and, in order to remove the solvent following its formation, anti-reflective coating layer 210 is subsequently exposed to a bake process at a temperature of approximately, but not limited to, 150 degrees Celsius.

Figure 2D:
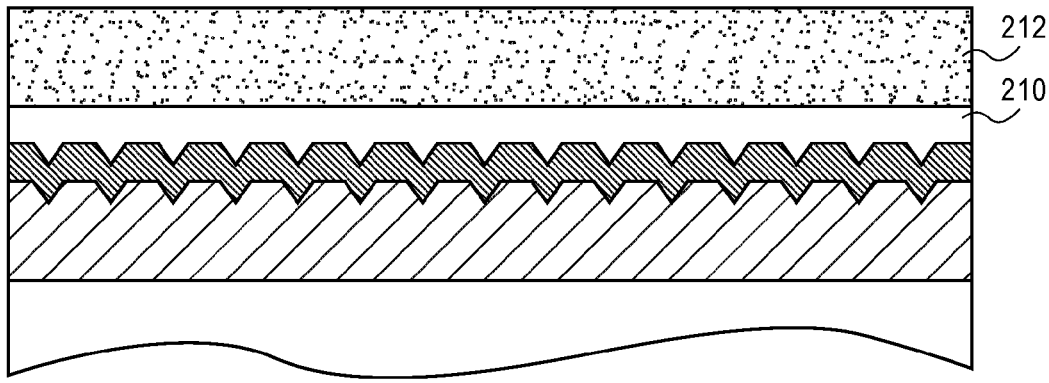

Referring again to operation 104 from Flowchart 100 and corresponding FIG. 2D, a photo-resist layer 212 is formed above anti-reflective coating layer 210. Photo-resist layer 212 may be composed of a material suitable for undergoing a lithographic process. In accordance with an embodiment of the present invention, photo-resist layer 212 is composed of a dry film resist or a liquid resist. In an embodiment, photo-resist layer 212 is composed of a negative tone liquid photo-resist. In one embodiment, photo-resist layer 212 is composed of a two-component DQN resist including a photoactive diazoquinone ester (DQ) and a phenolic novolak resin (N). Photo-resist layer 212 may be formed on anti-reflective coating layer 210 by a technique suitable to uniformly cover anti-reflective coating layer 210 and to provide a flat top surface to which a lithographic process is applied. In one embodiment, photo-resist layer 212 is a liquid photo-resist layer formed by a process such as, but not limited to, spray-coating or roll-coating onto the surface of anti-reflective coating layer 210. In another embodiment, photo-resist layer 212 is formed by a lamination process and is a dry film photo-resist layer. In one embodiment, the dry film photo-resist layer is cyclized poly(cis-isoprene) resin-based. In an embodiment, photo-resist layer 212 has a thickness approximately in the range of 10-15 microns. In an embodiment, photo-resist layer 212 is a negative tone or a positive tone photo-resist layer. In an embodiment, the composition of photo-resist layer 212 is selected to be chemically compatible with anti-reflective coating layer 210.

Figure 2E:
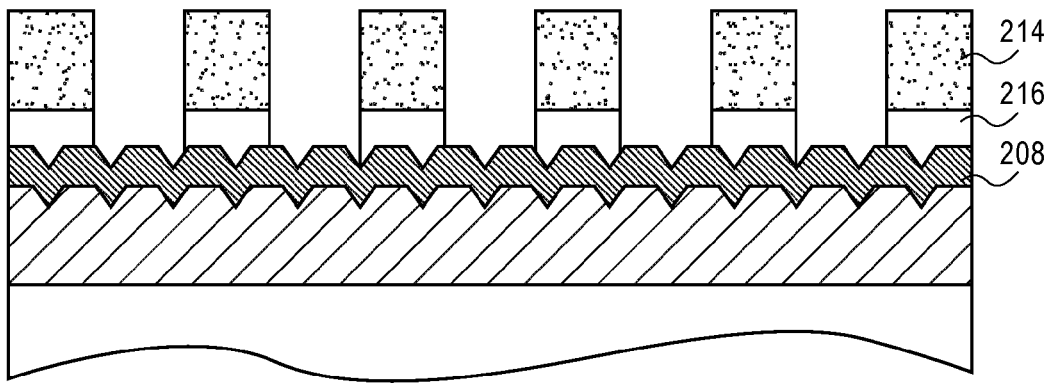

Referring to operation 106 from Flowchart 100 and corresponding FIG. 2E, photo-resist layer 212 and anti-reflective coating layer 210 are patterned to form a patterned photo-resist layer 214 and a patterned anti-reflective coating layer 216, respectively, to expose a first portion of seed layer 208, and to leave covered a second portion of seed layer 208. In accordance with an embodiment of the present invention, photo-resist layer 212 and anti-reflective coating layer 210 are patterned to form patterned photo-resist layer 214 and patterned anti-reflective coating layer 216 by a masked lithographic process. In that embodiment, photo-resist layer 212 and anti-reflective coating layer 210 are exposed to a light source via masked lithography which changes portions of photo-resist layer 212 and anti-reflective coating layer 210. In an embodiment, anti-reflective coating layer 210 absorbs light scattered by seed layer 208 during the lithographic exposure operation. In one embodiment, anti-reflective coating layer 210 is patterned to form patterned anti-reflective coating layer 216 in the same development process step used to pattern photo-resist layer 212. In that embodiment, photo-resist layer 212 is first exposed to a masked lithographic process.

Next, in the same process step, photo-resist layer 212 and anti-reflective coating layer 210 are developed to form patterned photo-resist layer 214 and patterned anti-reflective coating layer 216, respectively. In an embodiment, photo-resist layer 212 and anti-reflective coating layer 210 are developed by a solution such as, but not limited to, 1 weight % $Na_2CO_3$ or tetramethylammonium hydroxide (TMAH). In another embodiment, anti-reflective coating layer 210 is patterned to form patterned anti-reflective coating layer 216 in a different process step than the process step used to pattern photo-resist layer 212. In an embodiment, photo-resist layer 212 is first exposed to a masked lithographic and development process to form patterned photo-resist layer 214. Next, using patterned photo-resist layer 214 as a mask, anti-reflective coating layer 210 is dry or wet etched to form patterned anti-reflective coating layer 216.

Figure 2F:
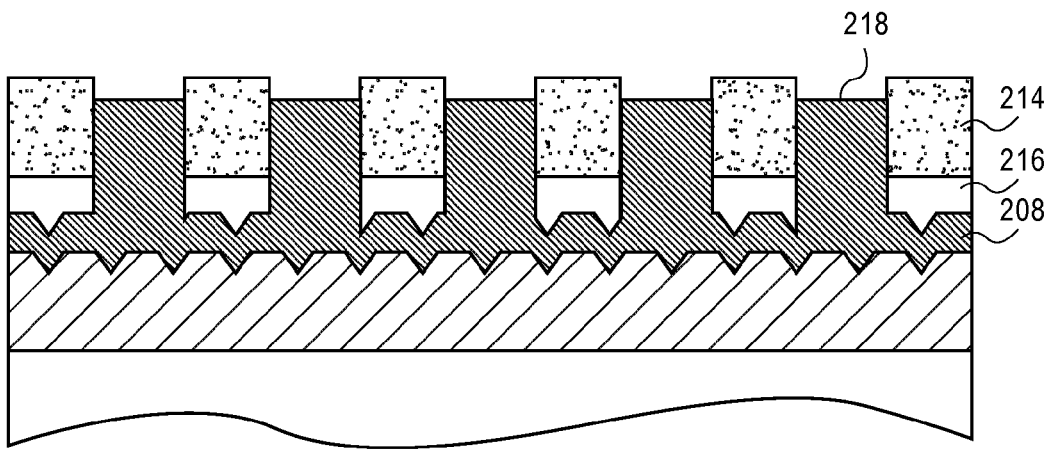

Referring to operation 108 from Flowchart 100 and corresponding FIG. 2F, a metal layer 218 is formed on the exposed portion of seed layer 208, between features of patterned photo-resist layer 214 and patterned anti-reflective coating layer 216. In accordance with an embodiment of the present invention, metal layer 218 is formed on the exposed portion of seed layer 208 by an electrolytic deposition process. Metal layer 218 may be composed of a metal suitable for strong adhesion with seed layer 208 and suitably conductive for forming a conductive line. In an embodiment, both seed layer 208 and metal layer 218 are composed of copper.

Figure 2G:
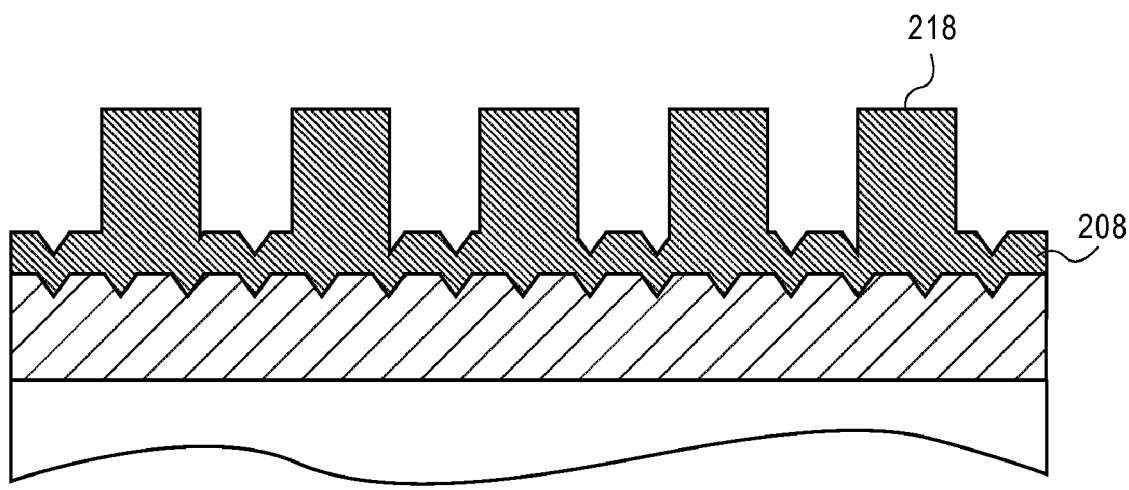

Referring to operation 110 from Flowchart 100 and corresponding FIG. 2G, patterned photo-resist layer 214 and patterned anti-reflective coating layer 216 are removed. In accordance with an embodiment of the present invention, patterned photo-resist layer 214 and patterned anti-reflective coating layer 216 are removed by a photoresist stripping solution. In an embodiment, patterned photo-resist layer 214 and patterned anti-reflective coating layer 216 are removed by an amine-based stripping solution. In one embodiment, patterned photo-resist layer 214 and patterned anti-reflective coating layer 216 are removed in the same process step. In an embodiment, patterned photo-resist layer 214 and patterned anti-reflective coating layer 216 are removed in separate process steps.

Figure 2H:
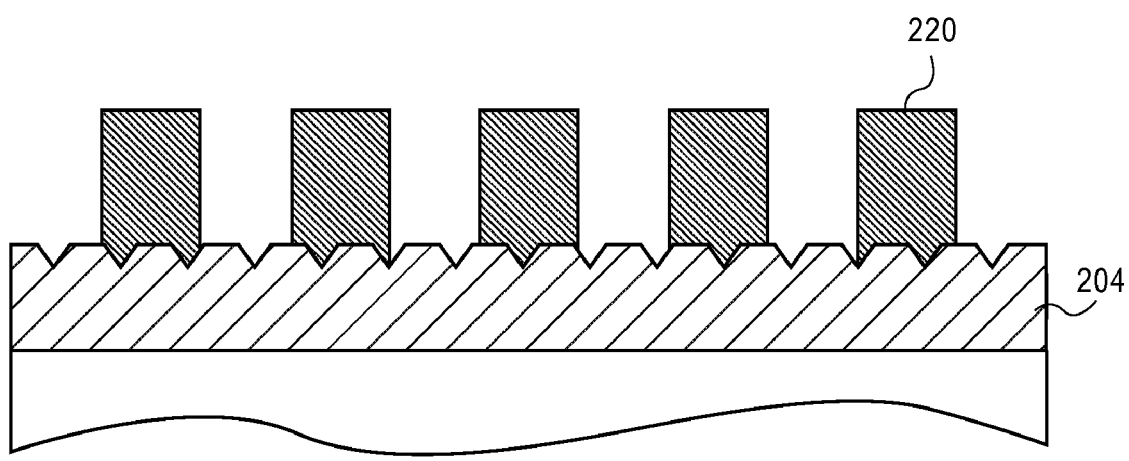

Referring to operation 112 from Flowchart 100 and corresponding FIG. 2H, the portion of seed layer 208 previously covered by patterned photo-resist layer 214 and patterned anti-reflective coating layer 216 is removed. In accordance with an embodiment of the present invention, this portion of seed layer 208 is removed to provide a series of metal lines 220 above dielectric layer 204. In one embodiment, the width of each line of the series of lines 220 is less than approximately 5 microns and the spacing between each line in the series of lines 220 is less than approximately 5 microns. The portion of seed layer 208 removed may be removed by a global dry or wet etch process. In an embodiment, the portion of seed layer 208 is removed in an $H_2O_2/H_2SO_4$ based etching solution. In one embodiment, the global etch process also reduces the height of each line in the series of lines 220, as depicted in FIGS. 2G and 2H.

Thus, a method for fabricating fine line and space routing has been disclosed. In accordance with an embodiment of the present invention, the method includes first providing a substrate having a dielectric layer and a seed layer disposed thereon. An anti-reflective coating layer and a photo-resist layer are then formed above the seed layer. The photo-resist layer and the anti-reflective coating layer are patterned to form a patterned photo-resist layer and a patterned anti-reflective coating layer, to expose a first portion of the seed layer, and to leave covered a second portion of the seed layer.

A metal layer is then formed on the first portion of the seed layer, between features of the patterned photo-resist layer and the patterned anti-reflective coating layer. The patterned photo-resist layer and the patterned anti-reflective coating layer are then removed. Finally, the second portion of the seed layer is removed to provide a series of metal lines above or below the dielectric layer. In one embodiment, the photo-resist layer and the anti-reflective coating layer are patterned in separate process steps. First, the photo-resist layer is exposed to a masked lithographic and development process to form the patterned photo-resist layer. Next, the anti-reflective coating layer is etched to form the patterned anti-reflective coating layer. In another embodiment, the photo-resist layer and the anti-reflective coating layer are patterned in the same process step. First, the photo-resist layer and anti-reflective coating layer are exposed to a masked lithographic process. Next, both the photo-resist layer and the anti-reflective coating layer are developed to form the patterned photo-resist layer and the patterned anti-reflective coating layer.

What is claimed is:

1. A method for fabricating fine line and space routing, comprising:
   forming a seed layer directly on a dielectric layer above a substrate, wherein the entire seed layer is formed directly on the dielectric layer;
   forming an anti-reflective coating layer and a photo-resist layer above said seed layer;
   patterning said photo-resist layer and said anti-reflective coating layer to form a patterned photo-resist layer and a patterned anti-reflective coating layer, to expose a first portion of said seed layer, and to leave covered a second portion of said seed layer;
   forming a metal layer on said first portion of said seed layer, between features of said patterned photo-resist layer and said patterned anti-reflective coating layer;
   removing said patterned photo-resist layer and said patterned anti-reflective coating layer; and
   removing said second portion of said seed layer to provide a series of metal lines above said dielectric layer.

2. The method of claim 1, wherein forming said anti-reflective coating layer comprises spray-coating or roll-coating said anti-reflective coating layer on said seed layer.

3. The method of claim 2, wherein said photo-resist layer is a liquid photo-resist layer, and wherein forming said photo-resist layer comprises spray-coating or roll-coating said photo-resist layer on said anti-reflective coating layer.

4. The method of claim 2, wherein forming said anti-reflective coating layer comprises using an organic compound and a dye.

5. The method of claim 1, wherein forming both said seed layer and said metal layer comprises using copper.

6. The method of claim 1, wherein removing said second portion of said seed layer to provide said series of metal lines comprises forming each line of said series of lines with a width less than approximately 5 microns and a spacing between each line of less than approximately 5 microns.

7. The method of claim 1, wherein a top surface of the dielectric layer is roughened.

8. A method for fabricating fine line and space routing, comprising:
   forming a seed layer on a substrate having a dielectric layer;
   forming an anti-reflective coating layer and a photo-resist layer directly on said seed layer;
   exposing said photo-resist layer to a masked lithographic and development process to form a patterned photo-resist layer;

etching said anti-reflective coating layer to form a patterned anti-reflective coating layer, to expose a first portion of said seed layer, and to leave covered a second portion of said seed layer;

forming a metal layer on said first portion of said seed layer, between and adjacent to features of said patterned photo-resist layer and said patterned anti-reflective coating layer;

removing said patterned photo-resist layer and said patterned anti-reflective coating layer; and removing said second portion of said seed layer to provide a series of metal lines above said dielectric layer.

9. The method of claim 8, wherein removing said patterned photo-resist layer and said patterned anti-reflective coating layer is performed in the same process step.

10. The method of claim 8, wherein forming said anti-reflective coating layer comprises spray-coating or roll-coating said anti-reflective coating layer on said seed layer.

11. The method of claim 10, wherein said photo-resist layer is a liquid photo-resist layer, and wherein forming said photo-resist layer comprises spray-coating or roll-coating said photo-resist layer on said anti-reflective coating layer.

12. The method of claim 10, wherein forming said anti-reflective coating layer comprises using an organic compound and a dye.

13. The method of claim 8, wherein forming both said seed layer and said metal layer comprises using copper.

14. The method of claim 8, wherein removing said second portion of said seed layer to provide said series of metal lines comprises forming each line of said series of lines with a width less than approximately 5 microns and a spacing between each line of less than approximately 5 microns.

15. A method for fabricating fine line and space routing, comprising:

forming a seed layer on a substrate having a dielectric layer;

forming an anti-reflective coating layer and a photo-resist layer above said seed layer;

exposing said photo-resist layer and said anti-reflective coating layer to a masked lithographic process;

developing, in the same process operation, said photo-resist layer and said anti-reflective coating layer to form a patterned photo-resist layer and a patterned anti-reflective coating layer, to expose a first portion of said seed layer, and to leave covered a second portion of said seed layer;

forming a metal layer on said first portion of said seed layer, between features of said patterned photo-resist layer and said patterned anti-reflective coating layer;

removing said patterned photo-resist layer and said patterned anti-reflective coating layer; and removing said second portion of said seed layer to provide a series of metal lines above said dielectric layer.

16. The method of claim 15, wherein removing said patterned photo-resist layer and said patterned anti-reflective coating layer is performed in the same process step.

17. The method of claim 15, wherein forming said anti-reflective coating layer comprises spray-coating or roll-coating said anti-reflective coating layer on said seed layer.

18. The method of claim 17, wherein said photo-resist layer is a liquid photo-resist layer, and wherein forming said photo-resist layer comprises spray-coating or roll-coating said photo-resist layer on said anti-reflective coating layer.

19. The method of claim 17, wherein forming said anti-reflective coating layer comprises using an organic compound and a dye.

20. The method of claim 15, wherein forming both said seed layer and said metal layer comprises using copper.

21. The method of claim 15, wherein removing said second portion of said seed layer to provide said series of metal lines comprises forming each line of said series of lines with a width less than approximately 5 microns and a spacing between each line of less than approximately 5 microns.

* * * * *